(12) United States Patent
Tomioka (10) Patent No.: US 9,543,905 B2
(45) Date of Patent: Jan. 10, 2017

(54) AMPLIFIER CIRCUIT

(71) Applicant: Seiko Instruments Inc., Chiba-shi, Chiba (JP)

(72) Inventor: Tsutomu Tomioka, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/594,773

(22) Filed: Jan. 12, 2015

(65) Prior Publication Data

US 2015/0207468 A1 Jul. 23, 2015

(30) Foreign Application Priority Data

Jan. 21, 2014 (JP) .................................. 2014-008824
Jul. 23, 2014 (JP) .................................. 2014-150030

(51) Int. Cl.
*H03F 1/52* (2006.01)
*H03F 1/22* (2006.01)

(52) U.S. Cl.
CPC .............. *H03F 1/523* (2013.01); *H03F 1/223* (2013.01); *H03F 2200/441* (2013.01)

(58) Field of Classification Search
CPC ..... H03F 1/223; H03F 1/523; H03F 2200/441
USPC ......................................... 330/298; 327/309
See application file for complete search history.

(56) References Cited

U.S. PATENT DOCUMENTS 7,342,448 B2 * 3/2008 Muhlbacher ............ H03F 3/217
                                                                    327/375
7,755,339 B2 * 7/2010 Kojima ..................... G05F 1/46
                                                                    323/280
2003/0122529 A1 * 7/2003 Lee .......................... G05F 1/569
                                                                    323/276

FOREIGN PATENT DOCUMENTS

JP          2005-311689 A     11/2005

OTHER PUBLICATIONS

Harrison, Linden, "An introduction to Depletion-mode MOSFETs" article first posted on the internet on Feb. 8, 2001.*

* cited by examiner

*Primary Examiner* — Steven J Mottola
*Assistant Examiner* — Hafizur Rahman
(74) *Attorney, Agent, or Firm* — Brinks, Gilson & Lione (57) ABSTRACT

Provided is an amplifier circuit including an NMOS transistor having a low drain breakdown voltage and an NMOS transistor having a high drain breakdown voltage connected in series thereto, and capable of preventing breakdown of a drain of the NMOS transistor having a low drain breakdown voltage. A clamp circuit configured to limit a drain voltage of the NMOS transistor having a low drain breakdown voltage is connected to the drain thereof.

14 Claims, 9 Drawing Sheets

AMPLIFIER CIRCUIT

RELATED APPLICATIONS

This application claims priority under 35 U.S.C. §119 to Japanese Patent Application Nos. 2014-008824 filed on Jan. 21, 2014 and 2014-150030 filed on Jul. 23, 2014, the entire contents of which are hereby incorporated by reference.

BACKGROUND OF THE INVENTION

1. Field of the Invention

The present invention relates to an amplifier circuit configured to prevent breakdown of a transistor when an input signal is at a ground level.

2. Description of the Related Art

Figure 9:
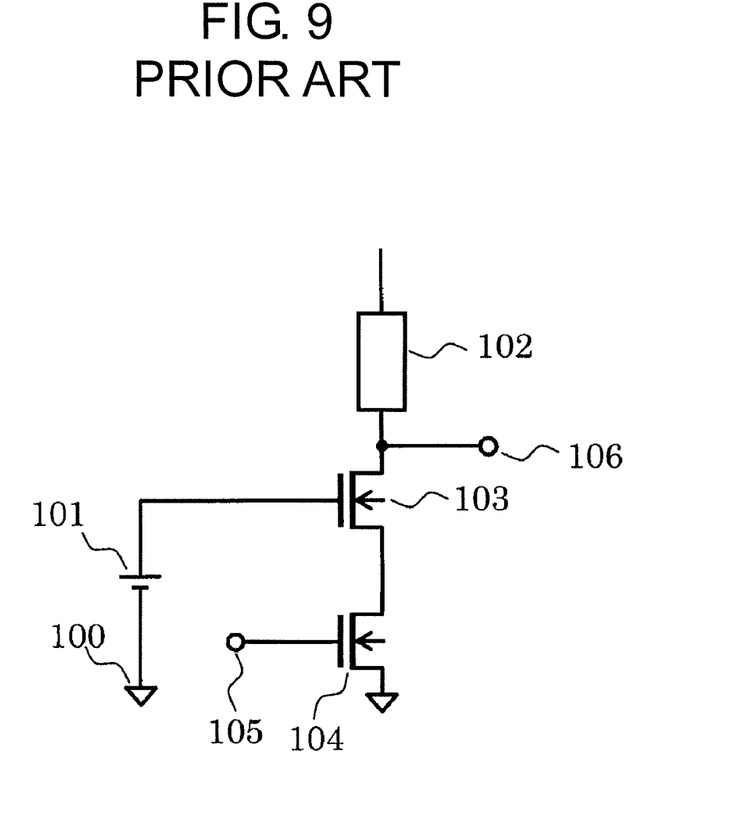
FIG. 9 is a circuit diagram illustrating a configuration of a related-art amplifier circuit.

A related-art amplifier circuit is now described. FIG. 9 is a circuit diagram illustrating the related-art amplifier circuit.

The related-art amplifier circuit includes a constant voltage circuit 101 configured to output a constant voltage, NMOS transistors 103 and 104, a load 102, a ground terminal 100, an output terminal 106, and an input terminal 105.

The input terminal 105 inputs an input signal voltage Vin, and the output terminal 106 outputs an output signal voltage Vout. Because the amplitude of a drain voltage of the NMOS transistor 104 is small, the NMOS transistor 104 to be used may have a low breakdown voltage. Thus, the NMOS transistor 104 to be used may be a normal breakdown voltage MOS transistor having a large value of transconductance gm. On the other hand, the transconductance gm of the NMOS transistor 103 has almost no contribution to an amplification factor of the whole amplifier circuit. Thus, with use of a high breakdown voltage MOS transistor only for the NMOS transistor 103, the impedance of the load 102 can be set to be high so that large output voltage amplitude may be generated, to thereby increase the gain of the whole amplifier circuit (see, for example, FIG. 1 of Japanese Patent Application Laid-open No. 2005-311689).

However, the related-art amplifier circuit has a problem in that, when the input signal voltage Vin is at a ground level and the load 102 is capable of supplying a current, the drain of the NMOS transistor 104 becomes floating to generate a voltage equal to or higher than a breakdown voltage of the transistor, resulting in breakdown of the transistor.

SUMMARY OF THE INVENTION

The present invention has been made in view of the above-mentioned problem, and provides an amplifier circuit configured to prevent a drain of an NMOS transistor from being broken down even when an input signal voltage is at a ground level.

In order to solve the related-art problem, an amplifier circuit according to one embodiment of the present invention has the following configuration.

The amplifier circuit includes: a first transistor including a gate connected to an input terminal; a second transistor including a gate connected to a constant voltage circuit, a drain connected to an output terminal, and a source connected to a drain of the first transistor, the second transistor having a drain breakdown voltage higher than a drain breakdown voltage of the first transistor; and a clamp circuit connected to the drain of the first transistor, and configured to limit a drain voltage of the first transistor.

The amplifier circuit according to one embodiment of the present invention includes the transistor having a low drain breakdown voltage and the transistor having a high drain breakdown voltage, and the clamp circuit is connected to the drain of the transistor having a low drain breakdown voltage. Thus, the drain voltage of the transistor having a low drain breakdown voltage can be limited by the clamp circuit. Consequently, the drain of the transistor having a low drain breakdown voltage can be prevented from being broken down.

DETAILED DESCRIPTION OF THE PREFERRED EMBODIMENTS

Now, embodiments of the present invention are described with reference to the accompanying drawings.

First Embodiment

Figure 1:
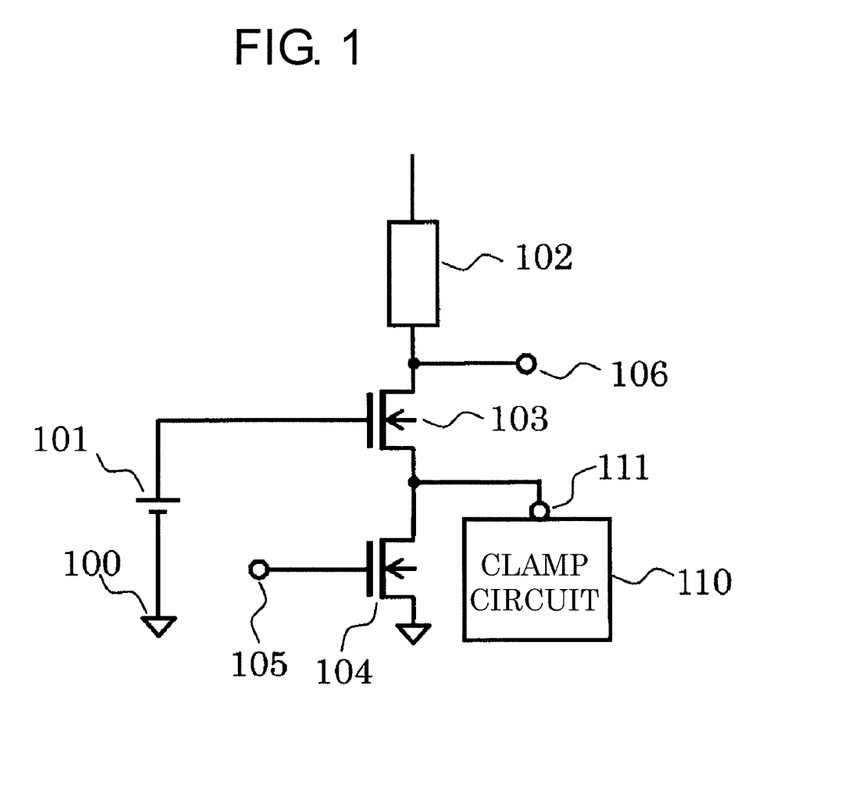
FIG. 1 is a circuit diagram illustrating a configuration of an amplifier circuit according to a first embodiment of the present invention.

FIG. 1 is a circuit diagram of an amplifier circuit according to a first embodiment of the present invention.

The amplifier circuit in the first embodiment includes a constant voltage circuit 101, NMOS transistors 103 and 104, a load 102, a ground terminal 100, an output terminal 106, an input terminal 105, and a clamp circuit 110.

The NMOS transistor 104 has a gate connected to the input terminal 105, a drain connected to a terminal 111 of the clamp circuit 110, and a source connected to the ground terminal 100. The NMOS transistor 103 has a gate connected to a positive electrode of the constant voltage circuit 101, a drain connected to the output terminal 106 and the load 102, and a source connected to the drain of the NMOS transistor 104. The constant voltage circuit 101 has a negative electrode connected to the ground terminal 100.

Figure 2:
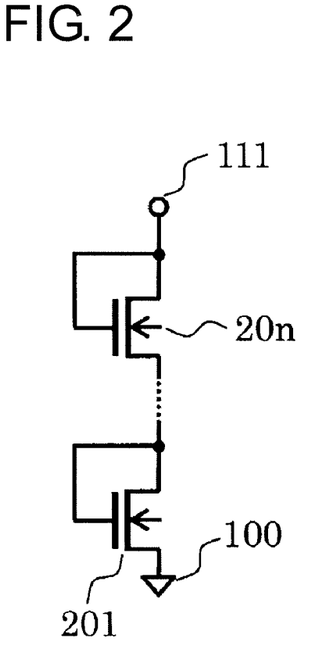
FIG. 2 is a circuit diagram illustrating an example of a clamp circuit.

FIG. 2 is a circuit diagram illustrating an example of the clamp circuit 110. The clamp circuit 110 includes n NMOS transistors 201 to 20$n$ ($n$ is an integer of 2 or more) connected in series, and the terminal 111.

The NMOS transistors 201 to 20$n$ each have a gate and a drain connected to each other, and are connected in series between the ground terminal 100 and the terminal 111.

Next, an operation of the amplifier circuit in the first embodiment is described.

The constant voltage circuit 101 outputs a constant voltage V2. The input terminal 105 inputs an input signal voltage Vin, and the output terminal 106 outputs an output signal voltage Vout. Because the amplitude of a drain voltage of the NMOS transistor 104 is small, the NMOS transistor 104 to be used has a low breakdown voltage so as to increase its transconductance gm. Transconductance gm of the NMOS transistor 103 has almost no contribution to an amplification factor of the whole amplifier circuit, and hence the NMOS transistor 103 is a high breakdown voltage MOS transistor having a high drain breakdown voltage. With such configuration, the impedance of the load 102 can be set to be high so that the amplitude of the output signal voltage Vout is increased, to thereby increase the gain of the whole amplifier circuit.

Now, the case is considered in which the load 102 is capable of supplying a current and the input signal voltage Vin is at a ground level. The NMOS transistor 103 is turned on because the constant voltage V2 is input to the gate thereof. The NMOS transistor 104 is turned off because the voltage at the ground level is input to the gate thereof, and then the drain of the NMOS transistor 104 becomes floating. When the terminal 111 has a clamp voltage V1 and the NMOS transistors 201 to 20n each have a threshold Vtn, the clamp voltage V1 is Vtn×n. Because the terminal 111 is connected to the drain of the NMOS transistor 104, the drain of the NMOS transistor 104 is not applied with a voltage equal to or higher than the clamp voltage V1 even when the drain of the NMOS transistor 104 becomes floating. Thus, the drain of the NMOS transistor 104 can be prevented from being broken down due to the generation of a voltage equal to or higher than a breakdown voltage thereof at the drain of the NMOS transistor 104. The clamp voltage V1 can be adjusted to any value through the adjustment of the number of the NMOS transistors 201 to 20n, and can be set in accordance with the drain breakdown voltage of the NMOS transistor 104.

Figure 3:
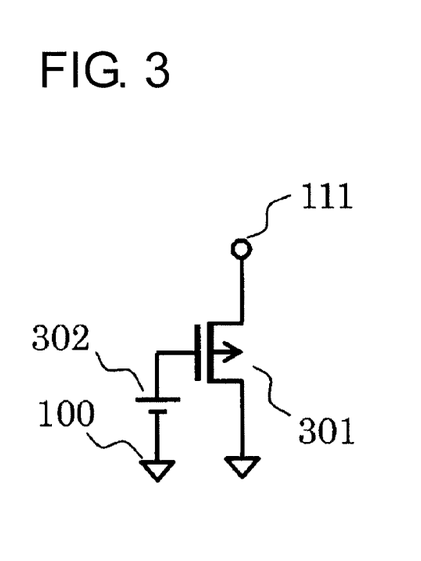
FIG. 3 is a circuit diagram illustrating another example of the clamp circuit.
Figure 4:
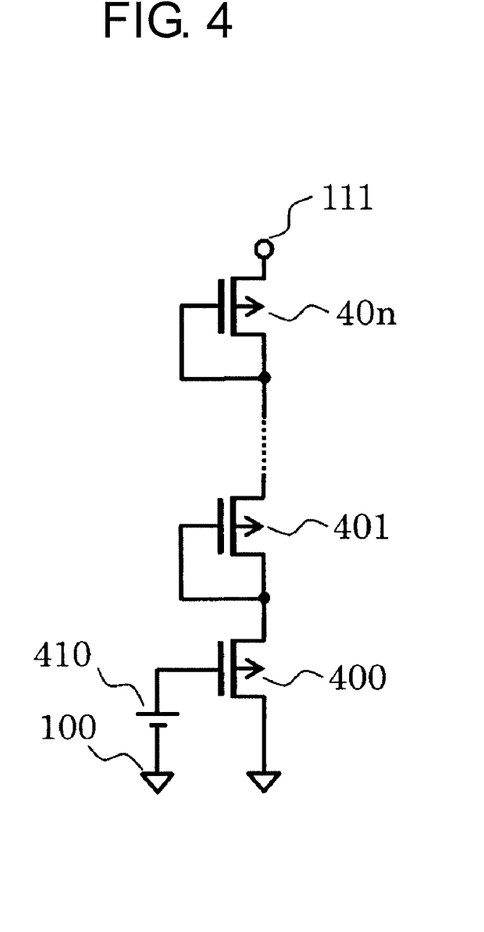
FIG. 4 is a circuit diagram illustrating still another example of the clamp circuit.

Note that, the clamp circuit 110 is not limited to the configuration of FIG. 2, and any configuration can be employed as long as the drain voltage of the NMOS transistor 104 is limited, such as configurations of FIGS. 3 and 4.

In a clamp circuit of FIG. 3, the clamp voltage V1 can be adjusted to any value based on a constant voltage output to a PMOS transistor 301 from a constant voltage circuit 302.

Further, in a clamp circuit of FIG. 4, the clamp voltage V1 can be adjusted to any value through the adjustment of the number of PMOS transistors 401 to 40n and based on a constant voltage output to a PMOS transistor 401 from a constant voltage circuit 410.

As described above, the amplifier circuit in the first embodiment is capable of limiting the drain voltage of the NMOS transistor 104 by the clamp circuit 110 even when the input signal voltage Vin is at the ground level. Consequently, the drain of the NMOS transistor 104 can be prevented from being broken down.

Second Embodiment

Figure 5:
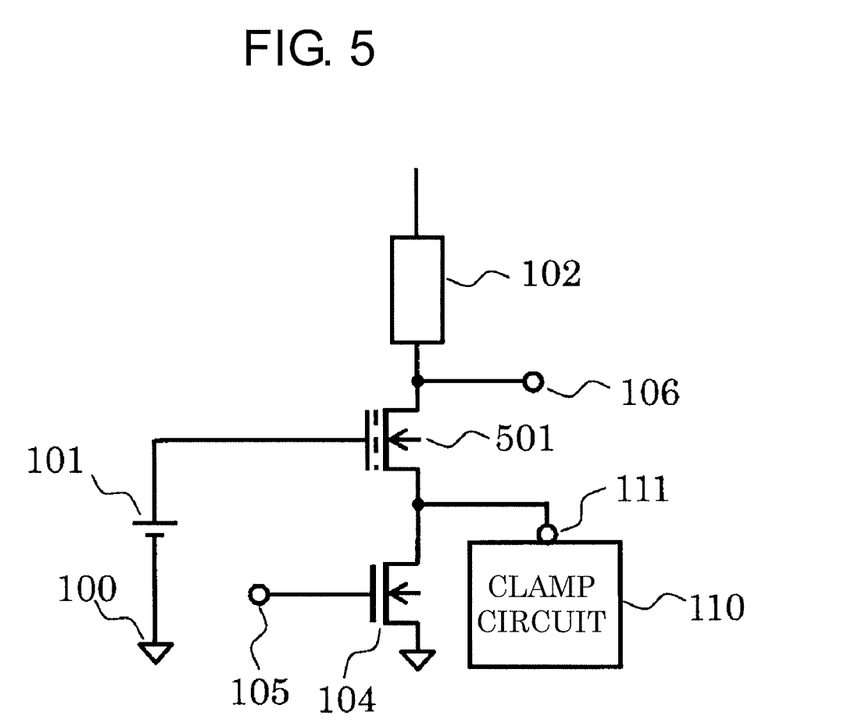
FIG. 5 is a circuit diagram illustrating a configuration of an amplifier circuit according to a second embodiment of the present invention.

FIG. 5 is a circuit diagram of an amplifier circuit according to a second embodiment of the present invention.

FIG. 5 differs from FIG. 1 in that the NMOS transistor 103 is changed to an N-channel depletion transistor 501. The rest is the same as in FIG. 1.

Also in the amplifier circuit having such circuit configuration, the effect of the clamp circuit 110 can be obtained similarly to the first embodiment. Specifically, even when the input signal voltage Vin is at the ground level, the drain of the NMOS transistor 104 is not applied with a voltage equal to or higher than the clamp voltage V1, and hence the drain of the NMOS transistor 104 can be prevented from being broken down.

Third Embodiment

Figure 6:
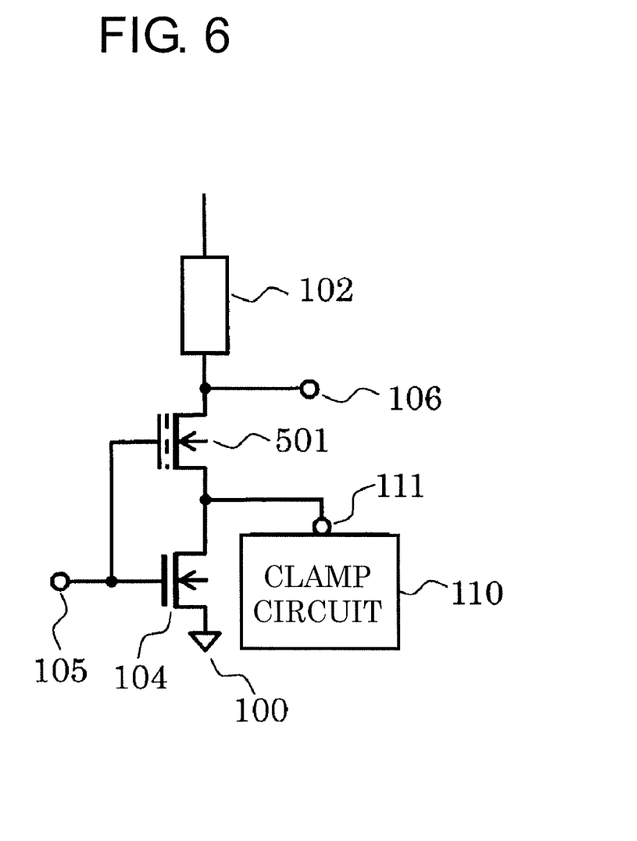
FIG. 6 is a circuit diagram illustrating a configuration of an amplifier circuit according to a third embodiment of the present invention.

FIG. 6 is a circuit diagram of an amplifier circuit according to a third embodiment of the present invention.

FIG. 6 differs from FIG. 5 in that a gate of the N-channel depletion transistor 501 is connected to the input terminal 105 and that the constant voltage circuit 101 is eliminated. The rest is the same as in FIG. 5.

Also in the amplifier circuit having such circuit configuration, the effect of the clamp circuit 110 can be obtained similarly to the first embodiment. Specifically, even when the input signal voltage Vin is at the ground level, the drain of the NMOS transistor 104 is not applied with a voltage equal to or higher than the clamp voltage V1, and hence the drain of the NMOS transistor 104 can be prevented from being broken down.

Fourth Embodiment

Figure 7:
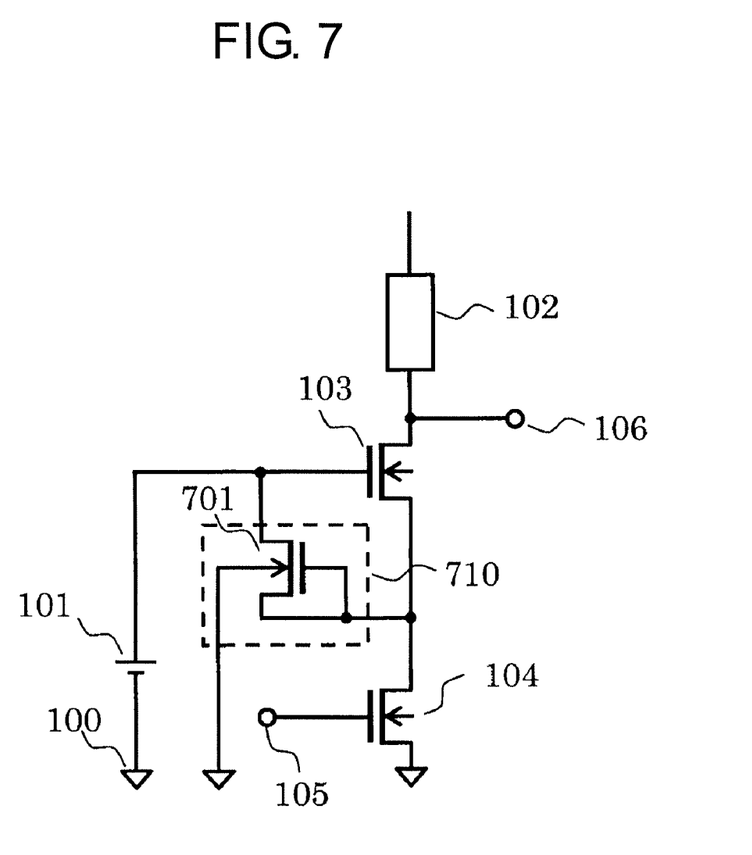
FIG. 7 is a circuit diagram illustrating a configuration of an amplifier circuit according to a fourth embodiment of the present invention.

FIG. 7 is a circuit diagram of an amplifier circuit according to a fourth embodiment of the present invention.

FIG. 7 differs from FIG. 1 in that a clamp circuit 710 is connected between the positive electrode of the constant voltage circuit 101 and the drain of the NMOS transistor 104. The rest is the same as in FIG. 1. The clamp circuit 710 includes, for example, an NMOS transistor 701 having a gate and a source both connected to the drain of the NMOS transistor 104 and a drain connected to the positive electrode of the constant voltage circuit 101.

The clamp circuit 710 is capable of clamping the drain voltage of the NMOS transistor 104 through the following operation.

When the drain voltage of the NMOS transistor 104 becomes higher than a voltage determined by adding a threshold voltage $Vt_{701}$ of the NMOS transistor 701 to the constant voltage V2 of the constant voltage circuit 101, the NMOS transistor 701 causes a current to flow. Accordingly, the drain voltage of the NMOS transistor 104 is clamped to the voltage of $V2+Vt_{701}$.

The amplifier circuit having such configuration can obtain the clamping effect similarly to the other embodiments. In addition, the clamp circuit 710 is configured to clamp the drain voltage of the NMOS transistor 104 by causing a current to flow therethrough via a channel of the NMOS transistor 701. Consequently, no current flows through a parasitic diode of the transistor, and hence there is an effect that no current flows to a substrate via a parasitic bipolar.

Fifth Embodiment

Figure 8:
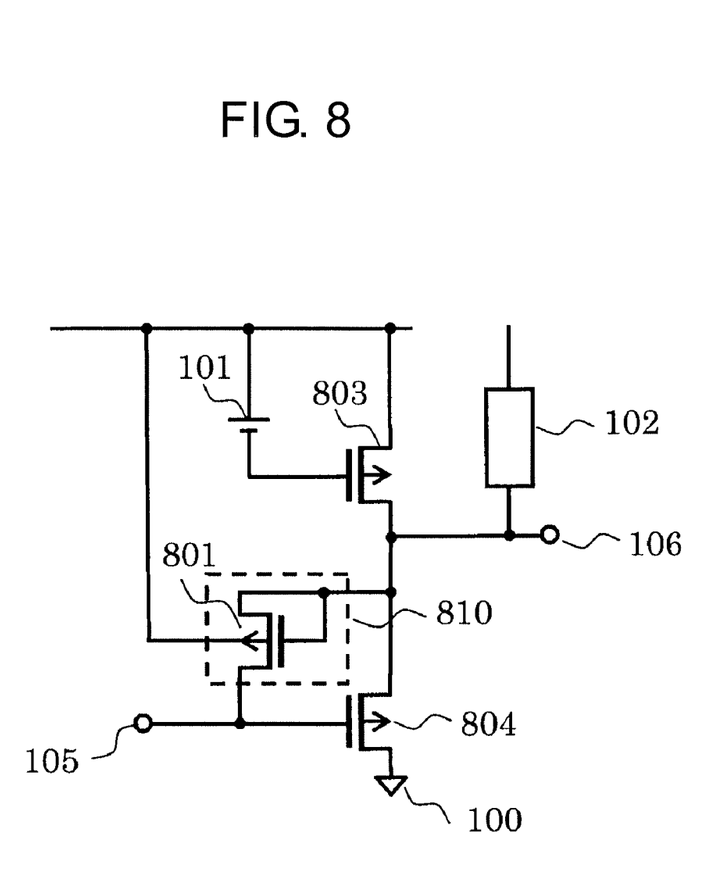
FIG. 8 is a circuit diagram illustrating a configuration of an amplifier circuit according to a fifth embodiment of the present invention.

FIG. 8 is a circuit diagram of an amplifier circuit according to a fifth embodiment of the present invention.

The amplifier circuit in the fifth embodiment includes the constant voltage circuit 101, PMOS transistors 803 and 804, the load 102, the ground terminal 100, the output terminal 106, the input terminal 105, and a clamp circuit 810.

The PMOS transistor 804 has a gate connected to the input terminal 105, a source connected to the output terminal 106, and a drain connected to the ground terminal 100. The PMOS transistor 803 has a gate connected to the negative electrode of the constant voltage circuit 101, a drain connected to the output terminal 106 and the load 102, and a source connected to a power supply terminal. The constant voltage circuit 101 has the positive electrode connected to the power supply terminal. The clamp circuit 810 is connected between the input terminal 105 and the source of the PMOS transistor 804. The clamp circuit 810 includes, for example, a PMOS transistor 801 having a gate and a source both connected to the source of the PMOS transistor 804 and a drain connected to the input terminal 105. In this case, the amplifier circuit in the fifth embodiment is a source follower formed by the PMOS transistor 803 having a low drain breakdown voltage and the PMOS transistor 804 being a high breakdown voltage MOS transistor having a high drain breakdown voltage.

The clamp circuit 810 is capable of clamping the drain voltage of the PMOS transistor 803 through the following operation.

When the constant voltage circuit 101 is turned off (0 V) so that a gate voltage of the PMOS transistor 803 becomes equal to a power supply voltage, the PMOS transistor 803 is turned off. When the impedance of the load 102 is high under a state in which a certain input signal voltage Vin is input to the input terminal 105, the voltage of the output terminal 106 becomes floating and reduced. In this case, when a drain voltage of the PMOS transistor 803 becomes lower than a voltage of the sum of the input signal voltage Vin of the input terminal 105 and a threshold voltage $Vt_{801}$ of the PMOS transistor 801, the PMOS transistor 801 causes a current to flow. Accordingly, the drain voltage of the PMOS transistor 803 is clamped to the voltage of $Vin+Vt_{801}$. The PMOS transistor 801 has no influence on the source follower operation because the PMOS transistor 801 is turned off in the normal operation in which the output signal voltage Vout is higher than the input signal voltage Vin.

The amplifier circuit having such configuration can obtain the clamping effect similarly to the other embodiments. In addition, the clamp circuit 810 is configured to clamp the drain voltage of the PMOS transistor 803 by causing a current to flow therethrough via a channel of the PMOS transistor 801. Consequently, no current flows through a parasitic diode of the transistor, and hence there is an effect that no current flows to a substrate via a parasitic bipolar.

As described above, the amplifier circuit according to the present invention includes the transistor having a low drain breakdown voltage and the transistor having a high drain breakdown voltage, and the clamp circuit is connected to the drain of the transistor having a low drain breakdown voltage. Thus, the drain voltage of the transistor having a low drain breakdown voltage can be limited by the clamp circuit. Consequently, the drain of the transistor having a low drain breakdown voltage can be prevented from being broken down. Note that, although not illustrated, even when the amplifier circuit of the present invention has a circuit configuration in which the relationship of power supply is reversed, the effect of the clamp circuit can be obtained similarly.

What is claimed is:

1. An amplifier circuit configured to amplify a signal input to an input terminal and to output the amplified signal to an output terminal, the amplifier circuit comprising:
    a first transistor including a gate directly connected to the input terminal;
    a second transistor including a drain connected to the output terminal and a source connected to a drain of the first transistor, the second transistor having a drain breakdown voltage higher than a drain breakdown voltage of the first transistor and being always in an operating state; and
    a clamp circuit connected between the drain of the first transistor and a power supply, and configured to limit a drain voltage of the first transistor.

2. An amplifier circuit according to claim 1, wherein the second transistor comprises an enhancement transistor including a gate connected to a constant voltage circuit.

3. An amplifier circuit configured to amplify a signal input to an input terminal and to output the amplified signal to an output terminal, the amplifier circuit comprising:
    a first transistor including a gate connected to the input terminal;
    a second transistor including a drain connected to the output terminal and a source connected to a drain of the first transistor, the second transistor having a drain breakdown voltage higher than a drain breakdown voltage of the first transistor and being always in an operating state; and
    a clamp circuit connected to the drain of the first transistor, and configured to limit a drain voltage of the first transistor;
    wherein the second transistor comprises a depletion transistor.

4. An amplifier circuit according to claim 3, wherein the second transistor includes a gate connected to a constant voltage circuit.

5. An amplifier circuit according to claim 3, wherein the second transistor includes a gate connected to the input terminal.

6. An amplifier circuit according to claim 1, wherein the clamp circuit comprises a plurality of diode-connected transistors connected in series.

7. An amplifier circuit according to claim 1, wherein the clamp circuit comprises a transistor including a gate connected to a constant voltage circuit.

8. An amplifier circuit according to claim 1, wherein the clamp circuit comprises:
    a transistor including a gate connected to a constant voltage circuit; and
    a plurality of diode-connected transistors,
    the transistor and the plurality of diode-connected transistors being connected in series.

9. An amplifier circuit according to claim 1, wherein the clamp circuit comprises a transistor including a gate and a source both connected to the drain of the first transistor and a drain connected to a constant voltage circuit.

10. An amplifier circuit configured to amplify a signal input to an input terminal and to output the amplified signal to an output terminal, the amplifier circuit comprising:
    a first transistor including a gate connected to a constant voltage circuit, a drain connected to the output terminal, and a source connected to a power supply terminal;
    a second transistor including a gate connected to the input terminal, a drain connected to a ground terminal, and a source connected to the output terminal, the second transistor having a drain breakdown voltage higher than a drain breakdown voltage of the first transistor; and
    a clamp circuit comprising a transistor including a gate and a source both connected to the drain of the first transistor and a drain connected to the input terminal, the clamp circuit being configured to limit a drain voltage of the first transistor.

11. An amplifier circuit according to claim 3, wherein the clamp circuit comprises a plurality of diode-connected transistors connected in series.

12. An amplifier circuit according to claim 3, wherein the clamp circuit comprises a transistor including a gate connected to a constant voltage circuit.

13. An amplifier circuit according to claim 3, wherein the clamp circuit comprises:
   a transistor including a gate connected to a constant voltage circuit; and
   a plurality of diode-connected transistors,
   the transistor and the plurality of diode-connected transistors being connected in series.

14. An amplifier circuit according to claim 3, wherein the clamp circuit comprises a transistor including a gate and a source both connected to the drain of the first transistor and a drain connected to a constant voltage circuit.

* * * * *